United States Patent
Müller

(10) Patent No.: US 12,292,461 B2
(45) Date of Patent: May 6, 2025

(54) RESONANT FREQUENCY CHANGE DETECTION

(71) Applicant: TEXAS INSTRUMENTS INCORPORATED, Dallas, TX (US)

(72) Inventor: Florian Thomas Müller, Buch am Erlbach (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 533 days.

(21) Appl. No.: 17/682,506

(22) Filed: Feb. 28, 2022

(65) Prior Publication Data
US 2023/0273249 A1    Aug. 31, 2023

(51) Int. Cl.
*G01R 22/06* (2006.01)
*H02M 1/36* (2007.01)
*H02M 3/335* (2006.01)

(52) U.S. Cl.
CPC ............ *G01R 22/066* (2013.01); *H02M 1/36* (2013.01); *H02M 3/335* (2013.01)

(58) Field of Classification Search
CPC ............. G01R 22/066; G01R 19/2513; H02M 3/33507; H02M 1/32
See application file for complete search history.

(56) References Cited

U.S. PATENT DOCUMENTS

| | | | | |
|---|---|---|---|---|
| 8,552,695 B2* | 10/2013 | Stracquadaini | ... | H02M 3/33507 323/283 |
| 11,674,987 B1* | 6/2023 | Yu | ......... | G01R 22/066 307/64 |
| 2013/0229832 A1* | 9/2013 | Patel | .................. | H02M 3/33507 363/21.12 |
| 2018/0156854 A1* | 6/2018 | Verhoeven | ....... | G06K 19/07798 |
| 2018/0351464 A1* | 12/2018 | Finkel | ............... | H02M 3/33507 |
| 2019/0260282 A1* | 8/2019 | Oh | ........................ | H02M 1/4241 |
| 2020/0076291 A1* | 3/2020 | Phadke | .................... | H02M 1/08 |
| 2021/0048462 A1* | 2/2021 | Ramirez | .............. | G11C 15/046 |
| 2021/0242789 A1* | 8/2021 | Su | ........................ | H02M 1/0025 |
| 2022/0271674 A1* | 8/2022 | Yang | ........................ | H02M 3/01 |
| 2022/0399820 A1* | 12/2022 | Chen | ................. | H02M 3/33507 |
| 2024/0120845 A1* | 4/2024 | Chen | ................. | H02M 3/33592 |

* cited by examiner

*Primary Examiner* — Jermele M Hollington
(74) *Attorney, Agent, or Firm* — Charles F. Koch; Frank D. Cimino

(57) ABSTRACT

At a switch terminal of a flyback converter in a discontinuous conduction mode in a power meter, an apparatus determines a resonant frequency of the flyback converter. The apparatus determines whether the resonant frequency satisfies a condition. Through a controller, the apparatus triggers an event responsive to determining that the resonant frequency satisfies the condition.

19 Claims, 6 Drawing Sheets

RESONANT FREQUENCY CHANGE DETECTION

TECHNICAL FIELD

This relates generally to magnetic tampering detection, and more particularly to measuring resonant frequency of electronic components to detect a magnetic tamper attack from an external magnetic field.

BACKGROUND

Smart meters, such as electric power meters, are electronic devices that record energy or resource consumption. Utilities companies install these meters at both residential and commercial locations to capture and communicate this information to the consumer and the utility company, in order to understand consumption behavior and charge consumers accordingly.

In attempts to illegally lower electric bills, criminals may tamper with accessible smart meters by placing a strong magnet near the smart meter's integrated power supply. As a result, the magnet can disrupt or even interrupt the operation of the power supply, such as an isolated switch mode power supply (SMPS) that includes a transformer. The transformer core can become saturated by an external magnetic field, thereby causing problems with the smart meter.

To alleviate this issue, Hall effect sensors can be placed near the transformer to measure changes in the magnetic field and detect magnetic tamper attacks. However, Hall effect sensors have additional circuitry to power the sensors and obtain data from them, thereby increasing the costs and development effort of smart meters.

SUMMARY

An example system includes a flyback converter having a resonant frequency and a discontinuous conduction mode. The flyback converter includes a controller, which is configured to: control the flyback converter; determine whether the resonant frequency satisfies a condition; and responsive to determining that the resonant frequency satisfies the condition, trigger an event.

DETAILED DESCRIPTION

Figure 1:
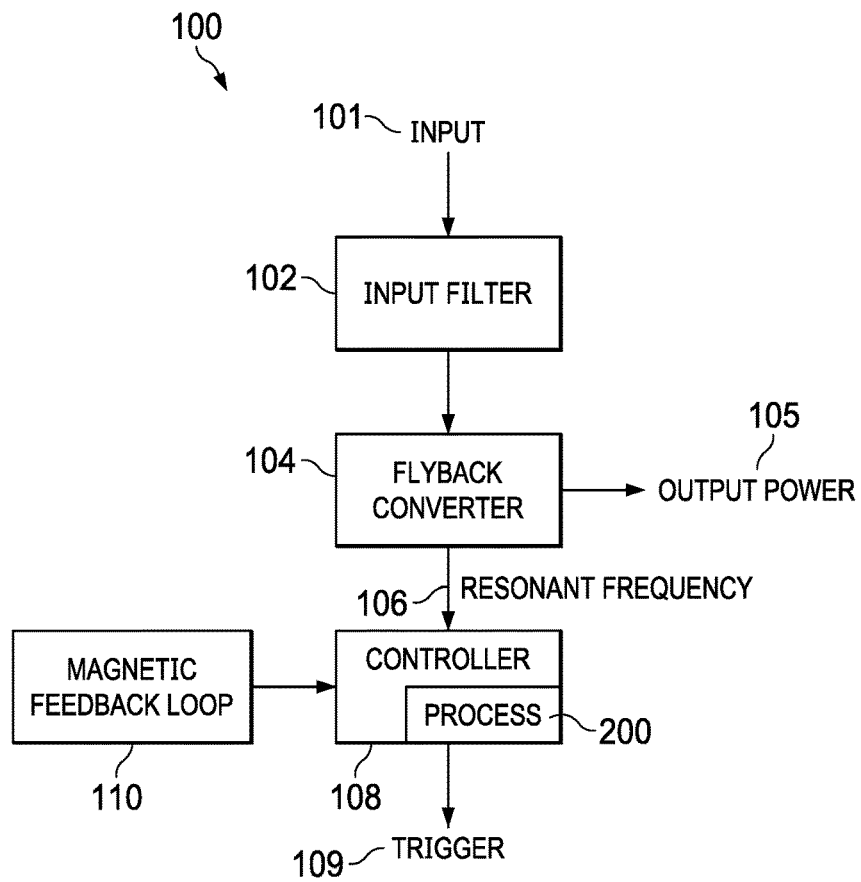
FIG. 1 illustrates an example operating architecture for magnetic tamper detection.

The drawings are not necessarily drawn to scale. In the drawings, like reference numerals designate corresponding parts throughout the several views. In some embodiments, components or operations may be separated into different blocks or may be combined into a single block.

In an example, resonant frequency detection techniques described herein detect magnetic tampering at reduced cost. Smart meters have internal, integrated power supplies including flyback converters to produce output power for the circuitry. By taking measurements at a switch terminal of the flyback converter, information about the primary inductance of a transformer and other data are collectable. The primary inductance and the switch terminal capacitance directly dictate the frequency of resonant ringing of the flyback converter, which remains constant under normal operating conditions as the inductance and capacitance remain unchanged. Further, the resonant frequency remains constant over input voltages and loads, but the resonant frequency increases if an external magnetic field is introduced. A controller of the flyback converter obtains measurements of the resonant frequency, determines whether the resonant frequency satisfies a condition, and performs actions responsive to a detected tampering attack, without additional circuitry or components. Such measurements can be obtained from any other isolated or non-isolated switch mode power supply topology that uses an inductor and operates in a discontinuous conduction mode (DCM).

In various embodiments, resonant frequency detection techniques perform magnetic tamper detection at reduced cost. More specifically, some embodiments measure and monitor resonant frequency waveforms to detect an external magnetic field near a smart meter. For example, a system includes a flyback converter having a resonant frequency and a discontinuous conduction mode. The flyback converter is configured to generate an output signal. The flyback converter includes a controller configured to: control the flyback converter; determine whether the resonant frequency satisfies a condition; and responsive to determining that the resonant frequency satisfies the condition, trigger an event.

In another embodiment, a computing apparatus includes a computer-readable storage medium and program instructions stored on the computer-readable storage medium that, when executed by the computing apparatus, direct the computing apparatus to perform various functions. In such an embodiment, the program instructions direct the computing apparatus to at least determine a resonant frequency of a flyback converter in a power meter, at a switch terminal of the flyback converter in a discontinuous conduction mode. The program instructions further direct the computing apparatus to determine whether the resonant frequency satisfies a condition. The program instructions also direct the computing apparatus to trigger, via a controller, an event responsive to determining that the resonant frequency satisfies the condition.

In yet another embodiment, a method determines a resonant frequency of a flyback converter in a power meter, at a switch terminal of the flyback converter in a discontinuous conduction mode. The method also determines whether the resonant frequency satisfies a condition. The method triggers, via a controller, an event responsive to determining that the resonant frequency satisfies the condition.

Advantageously, smart meters described herein can be constructed and monitored without extraneous circuitry to monitor for tampering attacks. The improvements and methods described herein provide reliable ways to detect an external magnetic field, such as from a strong magnet.

FIG. 1 illustrates an example operating architecture to perform magnetic tamper detection. FIG. 1 shows operating architecture 100, which further includes input filter 102, flyback converter 104, controller 108 and magnetic feedback loop 110. Input filter 102 receives input 101 and provides an electrical current to flyback converter 104 to generate output power 105 and resonant frequency 106. Controller 108, which may execute process 200, uses various measurements from flyback converter 104 and magnetic feedback loop 110 to provide trigger 109 downstream.

Operating architecture 100 is useful in a power meter, smart meter or other utility monitoring device. In operation, input 101 is an electrical input from a power source. Input 101 is provided to input filter 102 and ultimately can power components of operating architecture 100. Input filter 102 includes a transformer and filtering circuitry, such as a rectifier and one or more capacitors and inductors, which may form an LC circuit. Input filter 102 next provides its signals to flyback converter 104.

Flyback converter 104 may be implemented with a quasi-resonant flyback topology operating in a discontinuous conduction mode (DCM). Its design can include a transformer, one or more transistors, diodes, switches and other electrical components, such as capacitors and resistors. Flyback converter 104 can generate an output voltage for a power supply, load or other device, which is useful to power a smart meter or other electrical components, mechanical components and electro-mechanical components. In operation, windings of a transformer convert, increase, decrease and/or isolate an input voltage of input filter 102 to an output power 105. In operation, flyback converter 104 stores energy in primary inductance while a switch is on. The current of this switch ramps up and reaches a maximum peak current, at which point the switch turns off. Most of the energy is stored in the transformer's air gap. Then, the voltage of the transformer reverses, thereby causing energy to be delivered from primary windings to secondary windings producing output power 105. Following this, the secondary winding side loses current during the demagnetizing time, which allows the core of the transformer to demagnetize. Resonant ringing or frequency can then be measured at a switch terminal of the switch (e.g., drain-source voltage node), because it captures both the primary inductance and energy stored in the parasitic switch terminal capacitor. Regardless of the load current or input voltage of flyback converter 104, the resonant frequency 106 produced by flyback converter 104 remains nearly constant. Thus, by measuring this resonant frequency 106, issues with flyback converter 104 can be detected.

Controller 108, which executes process 200 and is responsible for controlling components in operating architecture 100, may be configured to measure or obtain measurements, and to monitor resonant frequency 106. Controller 108 can communicate with magnetic feedback loop 110 to obtain reference values and other configuration information, and it can communicate with flyback converter 104 to obtain power to function, and also to obtain measurements from components of flyback converter 104 and control flyback converter 104. Controller 108 can process information from the switch terminal voltage to operate features such as over-voltage protection, output regulation, under-voltage lockout or valley switching by connecting a pin of controller 108 to the switch terminal (or an auxiliary switch terminal).

In an example, controller 108 can obtain measurements from a primary side winding or a switch terminal voltage to determine resonant frequency 106. In other embodiments, controller 108 reads such measurements from other electrical components of flyback converter 104 or from a buffer or other device where resonant frequency measurements may be stored. Controller 108 determines whether the resonant frequency 106 satisfies a condition. An example of a condition includes a change in resonant frequency 106 beyond a threshold value (e.g., the resonant frequency is too high, and it exceeds the threshold). Accordingly, controller 108 can detect changes in resonant frequency 106 that meet the condition. Responsive to controller 108 determining that the resonant frequency 106 satisfies the condition, controller 108 generates trigger 109 and/or an indication of trigger 109. Trigger 109 can include alerts or actions, such as an alarm to notify a user of a magnetic tampering attack, an event to safely shut down power to the power meter, and events to capture recent data from the power meter to diagnose status before and after the tampering attack.

Process 200 executed by controller 108 can be performed on hardware, software or any combination thereof. Further, controller 108 can be one or more controllers, either within operating architecture 100 or functioning externally from operating architecture 100. In various embodiments, the one or more controllers can be microprocessors (such as microcontrollers) or other computing apparatus. The one or more controllers obtain trigger 109 (or the indication of trigger 109) and perform the one or more events responsive to trigger 109 in addition to or instead of controller 108. Controller 108 can communicate trigger 109 downstream via a wired or wireless network. For example, controller 108 may be configured to interact with a wired interface via RS-232, RS-485, VGA and ethernet. Controller 108 may be further configured to interact with a wireless interface via Bluetooth or WiFi.

One or more conditions regarding the resonant frequency 106 can be set by controller 108 or by a switch or other computing apparatus. For example, a controller can set a flag. And responsive to resonant frequency measurements satisfying the flag, one or more events can be triggered by controller 108 or another controller. In another example, controller 108 can monitor resonant frequency 106 of flyback converter 104 for changes in resonant frequency 106 that satisfy a condition. In that example, the condition may be met after a change in resonant frequency 106 exceeds a threshold resonant frequency.

Figure 2:
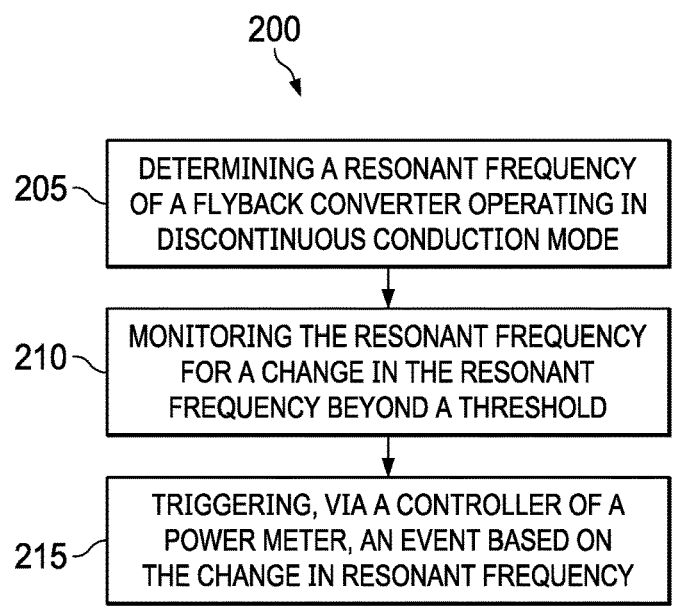
FIG. 2 illustrates a series of steps for detecting magnetic tampering in a power meter.

FIG. 2 illustrates a series of steps for detecting magnetic tampering in a power meter. FIG. 2 includes process 200 described parenthetically below, which references elements of FIG. 1. Process 200 can be implemented on software, hardware or any combination thereof. For example, process 200 can be executed on or by controller 108 of FIG. 1.

In operation 205, a computing apparatus (such as controller 108 of FIG. 1) determines a resonant frequency 106 of a flyback converter 104 operating in a discontinuous conduction mode. By obtaining measurements at a switch terminal of the flyback converter 104, information about the primary inductance of a transformer of the flyback converter 104 and other data are collectable. The primary inductance and the switch terminal capacitance directly dictate the frequency of resonant ringing (e.g., resonant frequency) of the flyback converter 104, which remains constant under normal operating conditions as the inductance and capacitance remain unchanged. In other embodiments, the resonant frequency 106 of flyback converter 104 is measurable at a different node within the circuitry. The resonant frequency measurements can be obtained and stored by a controller or other computing apparatus, or it may be read synchronously.

Next, in operation 210, the computing apparatus (e.g., controller 108) monitors the resonant frequency 106 for changes in the resonant frequency (e.g., amplitude and/or frequency) beyond a set threshold value. While the resonant frequency 106 remains constant over input voltages and/or load values, the resonant frequency 106 may increase due to the introduction of an external magnetic field near the transformer of flyback converter 104. In an example, the threshold value can be preprogrammed and account for drastic or abnormal changes in the value of resonant frequency 106 when compared to the resonant frequency 106 of flyback converter 104 operating under normal conditions. In other examples, controller 108 can determine the threshold value after a start-up and demagnetization period of the flyback converter 106, so controller 108 can account for an operational resonant frequency under normal conditions. In either case, controller 108 is configured to monitor resonant frequency 106 of flyback converter 104 for fluctuations. In further examples, the threshold may be considered a condition. Controller 108 determines whether the resonant frequency satisfies the condition. This may include detecting abnormalities or changes in resonant frequency 106 of flyback converter 104, instead of constant or frequent monitoring of the resonant frequency 106.

Lastly, in operation 215, the computing apparatus (e.g., controller 108) triggers an event responsive to the change in resonant frequency that breaches the threshold value or satisfies the condition. For example, if controller 108 detects that resonant frequency 106 has increased beyond the programmed threshold, then it may alert/notify a user of an issue, such as a magnetic tampering attack on the power meter, via a wired or wireless interface. In some embodiments, the alert or notification created by controller 108 may be in the form of an electronic message that can be sent to a user, a computing apparatus and/or elsewhere. In another example, controller 108 can shut down the power meter to prohibit an attacker from disrupting the power meter's operations and ruining the integrity of the components of the power meter. Under the example described above, controller 108 may also capture and save any power meter data leading up to the detection. Other trigger events and/or alerts are useful with techniques described herein. Moreover, controller 108 can communicate the detection of an attack to an additional controller, which may be configured to enact such triggers.

Figure 3:
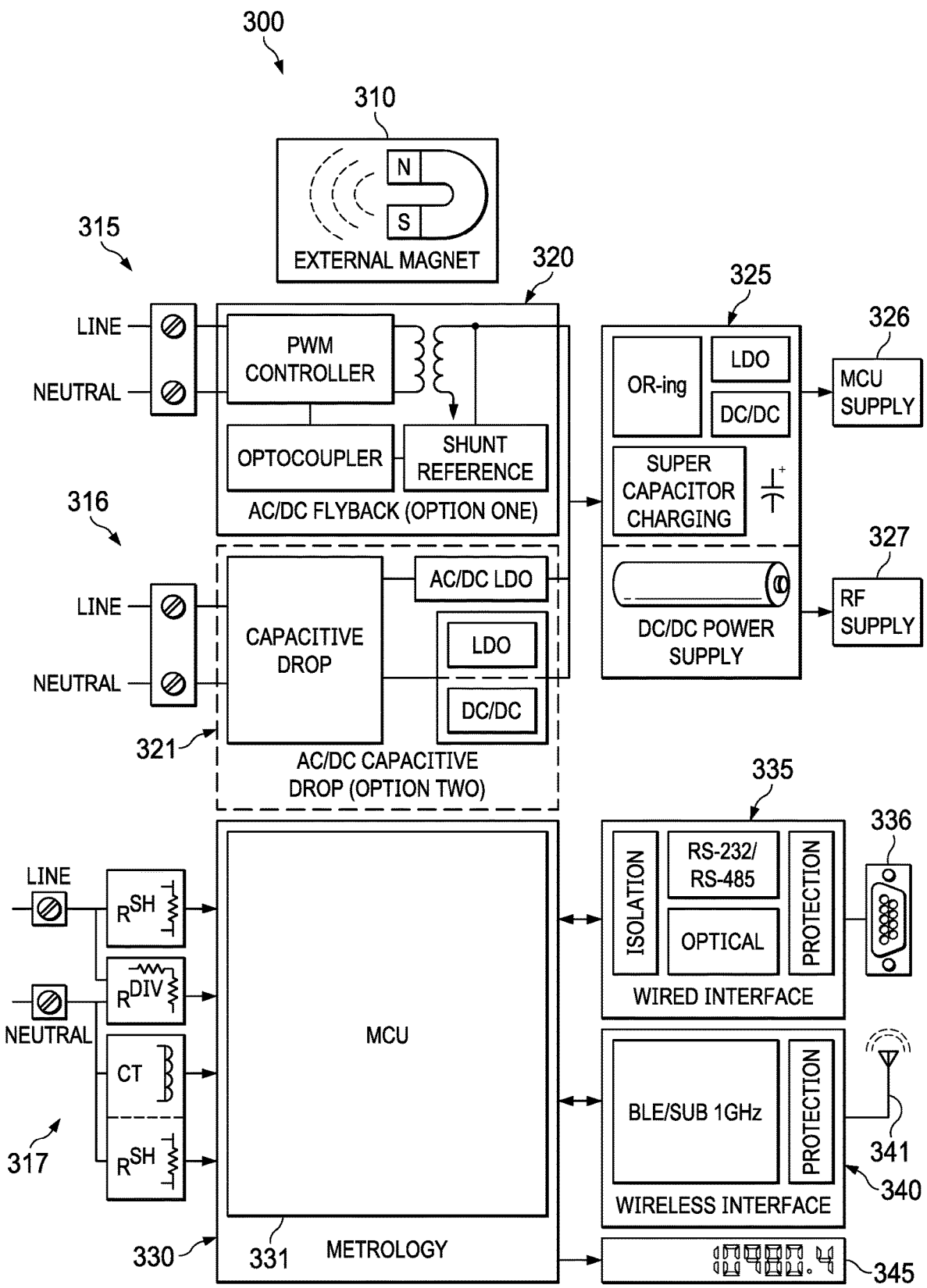
FIG. 3 illustrates an example operating environment for detecting magnetic tampering in a power meter.

FIG. 3 illustrates an example operating environment for detecting magnetic tampering in a power meter. FIG. 3 includes operating environment 300, which further includes external magnet 310, power inputs 315, 316 and 317, AC/DC flyback 320, AC/DC capacitive drop 321, power supply 325, microcontroller (MCU) supply 326, RF supply 327, metrology 330, MCU 331, wired interface 335, VGA output 336, wireless interface 340, wireless output 341 and meter interface 345. In various embodiment, operating environment 300 can implement a smart meter schematic having inputs, outputs and components of the smart meter, some of which may be affected by an external magnetic field that causes resulting issues.

In operation, a power input or supply (e.g., power input 315) includes a line and a neutral that provides power to a smart meter of operating environment 300. In a first embodiment, the smart meter uses AC/DC flyback 320 to convert the line power of power input 315 to energize power supply 325. AC/DC flyback 320 can include a pulse-width modulation (PWM) controller, a transformer, optocoupler, shunt reference resistor and other electronic, mechanical and/or electromechanical components. AC/DC flyback 320 can provide its converted signals to power supply 325, which may include a super charging capacitor, a DC/DC converter, a low-dropout regulator (LDO), a diode OR-ing device and/or a DC/DC power supply. In various examples, the power supply 325 can provide energy for both MCU supply 326 and RF supply 327. Because AC/DC flyback 320 includes a transformer, a proximity of external magnet 310 can disrupt normal operations of AC/DC flyback 320. Usually, AC/DC flyback 320 can generate constant resonant ringing due to its design. The resonant ringing is not impacted by varied loads, input voltage or current. But an external magnetic field generated by external magnet 310 can impact the resonant frequency.

In a second embodiment, the smart meter can use AC/DC capacitive drop 321 instead of AC/DC flyback 320 to convert energy from a line (e.g., power input 316). AC/DC capacitive drop 321 includes a capacitive drop or capacitive power supply, an AC/DC LDO and a DC/DC converter. AC/DC capacitive drop 321 can also provide its output signal to power supply 325, in order to further power MCU supply 326 and RF supply 327. In this embodiment, both power input 315 and AC/DC flyback 320 may be absent from operating environment 300. However, both may exist while one remains inactive.

Operating environment 300 also includes a further power input 317 to provide input power to metrology 330. Between the line and neutral of power input 317 and metrology 330, operating environment 300 can include various shunt resistors or other components. Metrology 330 includes MCU 331 that can control various functions of the smart meter and components of operating environment 300. MCU 331 can be coupled with both a wired interface 335 and a wireless interface 340 for a user to interact with MCU 331. Wired interface 335 can include isolation, optical and protection components, and connection ports for interfacing with RS-232 and/or RS-485, for example. Wired interface 335 can further connect with VGA output 336. But in other embodiments, VGA output 336 may be any type of wired interface protocol. Wireless interface 340 can include a Bluetooth low energy circuit, protection components and other wireless interfacing components for connection to wireless output 341. In various embodiments, wired interface 335 or wireless interface 340 is useful to communicate triggers, indications, events or alerts downstream to a user and/or computing apparatus in the event of a detected magnetic tampering attack.

MCU 331 can further be coupled with a meter interface 345 to display information, such as power consumption, issues with the smart meter, or a magnetic tampering attack alert. For example, under normal operation, the smart meter (via MCU 331) can display a numeric value on meter interface 345. In another example where external magnet 310 is proximate, AC/DC flyback 320 may operate abnormally due to an external magnetic field. As a result, MCU 331 can detect an irregular resonant frequency of AC/DC flyback 320 and display an alert (e.g., a textual value) on meter interface 345.

Figure 4:
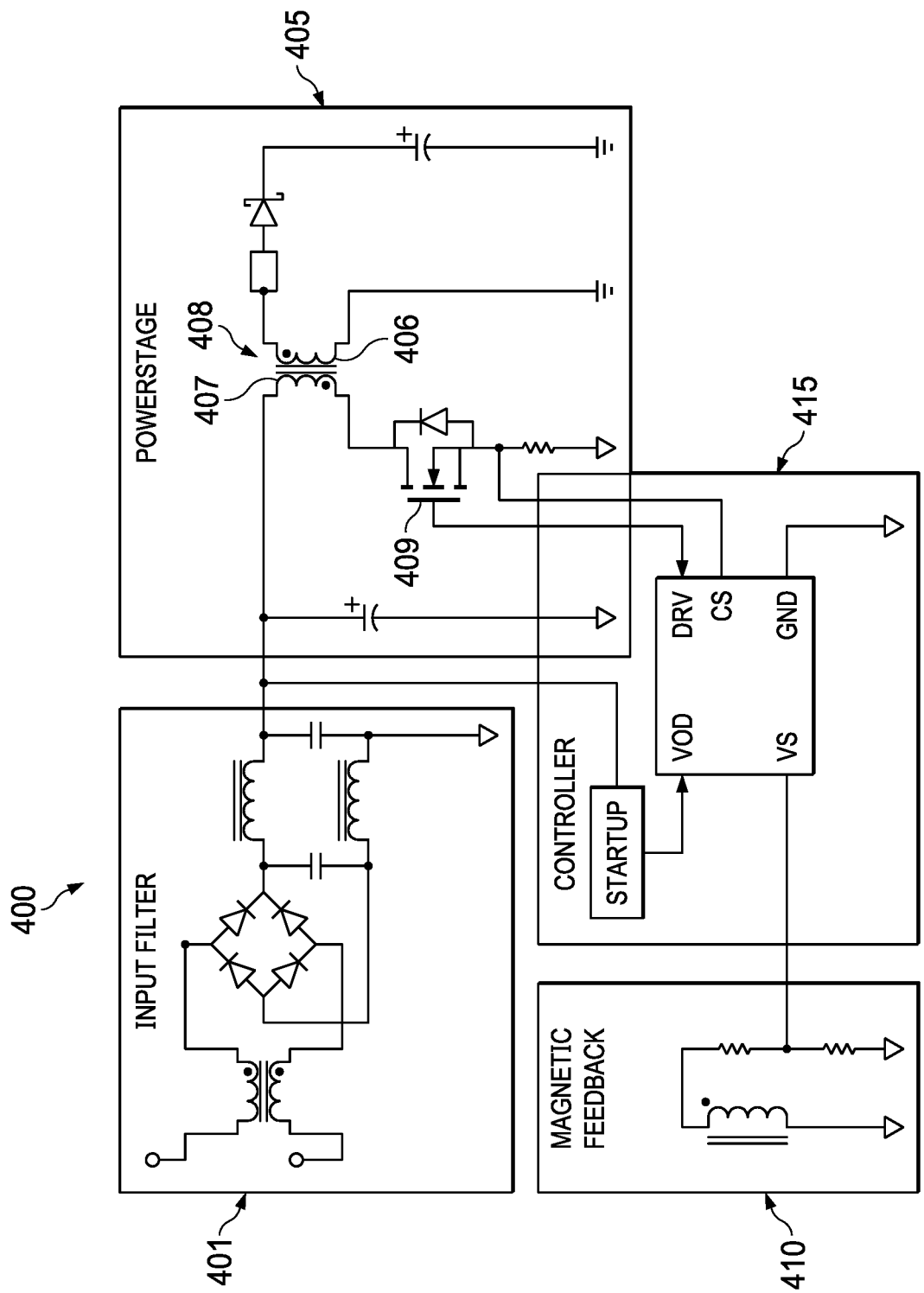
FIG. 4 is an example schematic of a flyback converter for magnetic tamper detection.

FIG. 4 is an example schematic of a flyback converter useful in magnetic tamper detection. FIG. 4 includes operating environment 400, which further includes input filter 401, power stage 405, magnetic feedback loop 410 and controller 415. Power stage 405 includes transformer 406 having primary winding node 407 and secondary winding node 408 and Q1 409 (a switch).

Operating environment 400 may implement a schematic in a power meter, smart meter or other utility-usage monitoring device. In operation, input filter 401 receives an electrical input from a power source, such as a grid or power supply. Input filter 401 may power operating environment 400 and its components. Input filter 401 includes a transformer and filtering circuitry, such as a rectifier and one or more capacitors and inductors, which may form an LC circuit. Input filter 401 next provides its output signal to power stage 405.

Power stage 405 can include a quasi-resonant flyback topology operating in a discontinuous conduction mode (DCM) and including a transformer 406, a switching component (Q1 409 or an FET) and other electrical components, such as diodes, capacitors and resistors. Power stage 405 may be configured to generate an output voltage for a load, which is useful to power a smart meter or other electrical components, mechanical components and electro-mechanical components. In operation, primary winding node 407 of transformer 406 transfers power to secondary winding node 408, in order to increase, decrease or isolate the voltage from input filter 401. Primary winding node 407 is also coupled to Q1 409, which can provide various measurements on the input signal, provide controls and/or switching, and more. Primary winding node 407 is the connection between transformer 406's primary winding and Q1 409, so it captures the drain-to-source voltage of Q1 409.

Controller 415 enables control of power stage 405 and can monitor measurements and/or detect changes in measurements of Q1 409 along with other components. In various embodiments, controller 415 may be programmed to obtain measurements and monitor resonant frequency of the signals of power stage 405. For example, the resonant frequency is measurable at primary winding node 407 or at the magnetic feedback loop 410. Because power stage 405 may have a flyback topology, the resonant frequency (after a demagnetization and start-up period of the operating environment) remains nearly constant during operation in DCM. Controller 415 may also communicate with magnetic feedback loop 410 to receive inputs, reference values and other values, in order to ensure accurate monitoring of power stage 405 measurements. A flyback topology having a secondary-side error amplifier and an optocoupler can also be used, instead of the primary-side regulated controller (e.g., controller 415 of FIG. 4), because such topology usually has a primary winding to power the controller and to provide other features, such as overvoltage protection and undervoltage lookout. Furthermore, other isolated or non-isolated topologies can be used if they work in DCM.

In various embodiment, the resonant frequency of a signal of power stage 405 does not change, regardless of varying input voltages, load currents or similar fluctuations. Instead, the resonant frequency changes based on proximity of an external magnetic field (such as from a magnet) near transformer 406. Responsive to detecting such a change or determining that the resonant frequency satisfies a condition, controller 415 is configured to trigger and/or perform one or more events. However, not all changes in resonant frequency may result in controller 415 triggering these events. For example, a set threshold or condition can be programmed into controller 415. Responsive to satisfying the condition (such as breaching the threshold), controller 415 may act accordingly. Other examples of conditions may include falling below a particular frequency or amplitude, exceeding a particular frequency or amplitude, or operating at an inconsistent frequency for a particular period. The events may include sounding an alarm, shutting down the power meter, saving last-gasp data, capturing measurements and data of the power meter responsive to detecting the tamper attack, and more.

An additional controller (such as a microcontroller) can be configured in operating environment 400. In an example embodiment, a microcontroller can obtain measurements of the resonant frequency at any node of power stage 405, such as primary winding node 407, secondary winding node 408 and/or switch terminal of Q1 409. Accordingly, microcontroller can act independently of controller 415. In various examples, the microcontroller may be configured to monitor changes in the resonant frequency or detect the meeting of conditions. The microcontroller can then trigger one or more events responsive to a change detected in the resonant frequency or responsive to determining that a condition is satisfied, either of which may indicate a magnetic tampering attack. Further, the microcontroller is configured to communicate the one or more events and/or execute one or more of the events itself, such as performing a safe shutdown or sounding an alarm.

In another embodiment, the additional controller (such as a microcontroller) can perform in conjunction with controller 415 to perform one or more events triggered by controller 415 responsive to a change in resonant frequency. For example, responsive to controller 415 detecting a magnetic tamper attack, it can communicate an indication of the attack to the further controller, which can then perform actions responsive to the indication.

Figure 5:
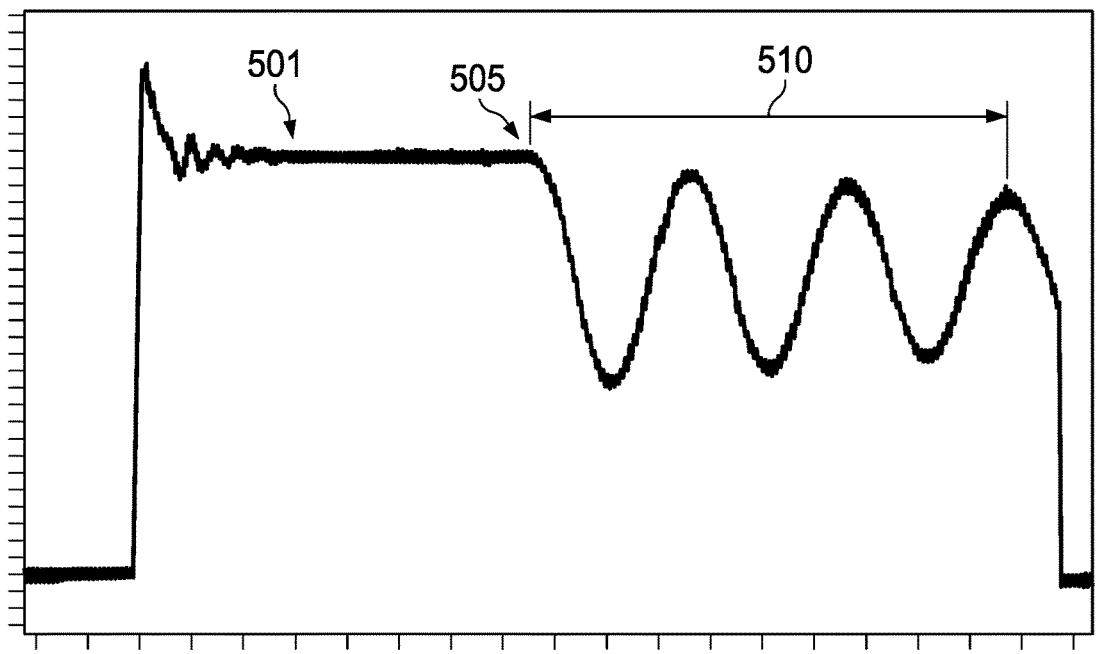
FIG. 5 illustrates a sample output waveform of an example operating environment for magnetic tamper detection processes.

FIG. 5 illustrates a sample output waveform of an example operating environment for magnetic tamper detection. FIG. 5 shows waveform 500, which includes switch terminal voltage 501, demagnetization point 505 and resonant frequency 510. For example, waveform 500 can be implemented in accordance with a schematic, system or method described above, such as by flyback converter 104 of FIG. 1, AC/DC flyback 320 of FIG. 3, and/or power stage 405 of FIG. 4.

Waveform 500 demonstrates voltage measurements obtained from a switch terminal of a flyback converter in various embodiments. However, similar voltage characteristics can be obtained from other nodes of a flyback converter. The flyback converter works by storing energy in the primary inductance while the primary switch Q1 is on. The primary current ramps up, and Q1 turns off after the primary maximum peak current is reached. Then, the voltage of the transformer reverses, and energy is delivered to the secondary side. While in the discontinuous conduction mode, the secondary side of the transformer current ramps down to zero, and the core of the transformer is completely demagnetized at demagnetization point 505. From demagnetization point 505, a resonant ringing or resonant frequency 510 of the switch terminal voltage 501 (drain-to-source voltage of Q1) is created, which is caused by the primary inductance and the energy stored in the parasitic switch terminal capacitance. Accordingly, resonant frequency 510 remains constant during a switching cycle until the flyback converter ceases operation.

Figure 6:
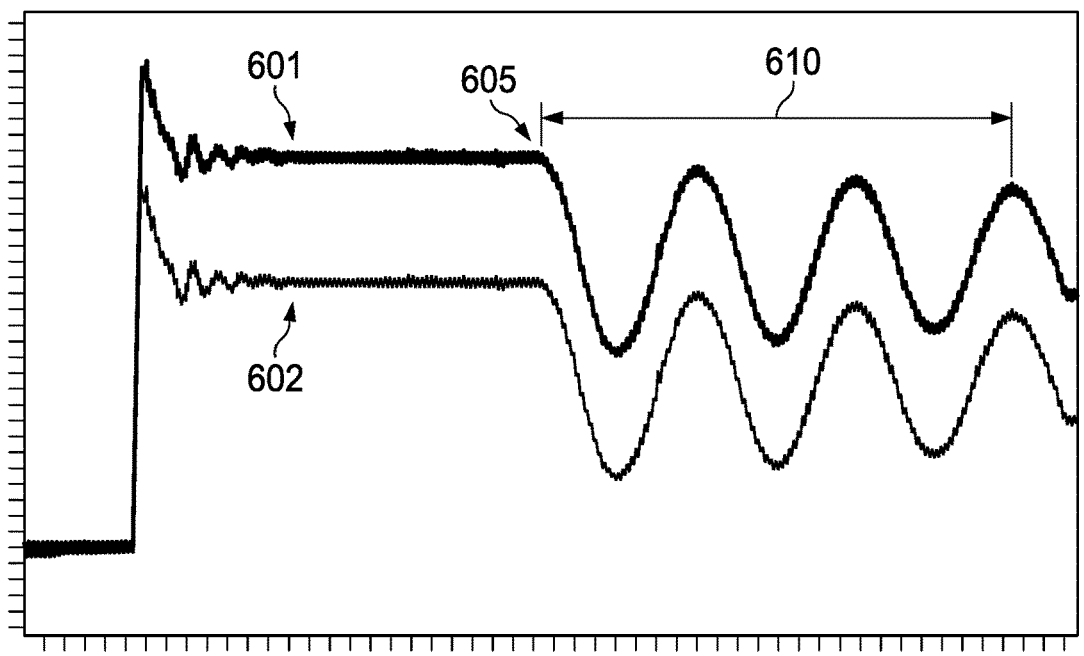
FIG. 6 illustrates a sample output waveform of an example operating environment for magnetic tamper detection.

FIG. 6 illustrates a sample output waveform of an example operating environment for magnetic tamper detection. FIG. 6 shows waveform 600, which includes switch terminal input voltage 601, switch terminal input voltage 602, demagnetization point 605 and resonant frequencies 610. For example, waveform 600 can be implemented in accordance with a schematic, system or method described above, such as by flyback converter 104 of FIG. 1, AC/DC flyback 320 of FIG. 3, and/or power stage 405 of FIG. 4.

Waveform 600 also demonstrates resonant ringing with respect to switch terminal voltage of a flyback converter. Waveform 600 includes switch terminal input voltage 601 and switch terminal input voltage 602, which represent measurements of input voltages of 273 VAC and 170 VAC, respectively. As the flyback converter initializes, current and voltage ramp up, thereby causing energy to be stored while a switch of the flyback converter is on. Eventually, the transformer reverses, thereby causing energy to jump from the primary side windings to the secondary side windings. Then, the transformer current and voltage ramp down and lead to demagnetization point 605 where the transformer's core is completely demagnetized. At that point, the resonant frequency 610 of the flyback converter remains constant, regardless of input voltage (e.g., switch terminal input voltage 601 and switch terminal input voltage 602). As a result, it can be determined that input voltage does not impact resonant ringing over a switching cycle.

Figure 7:
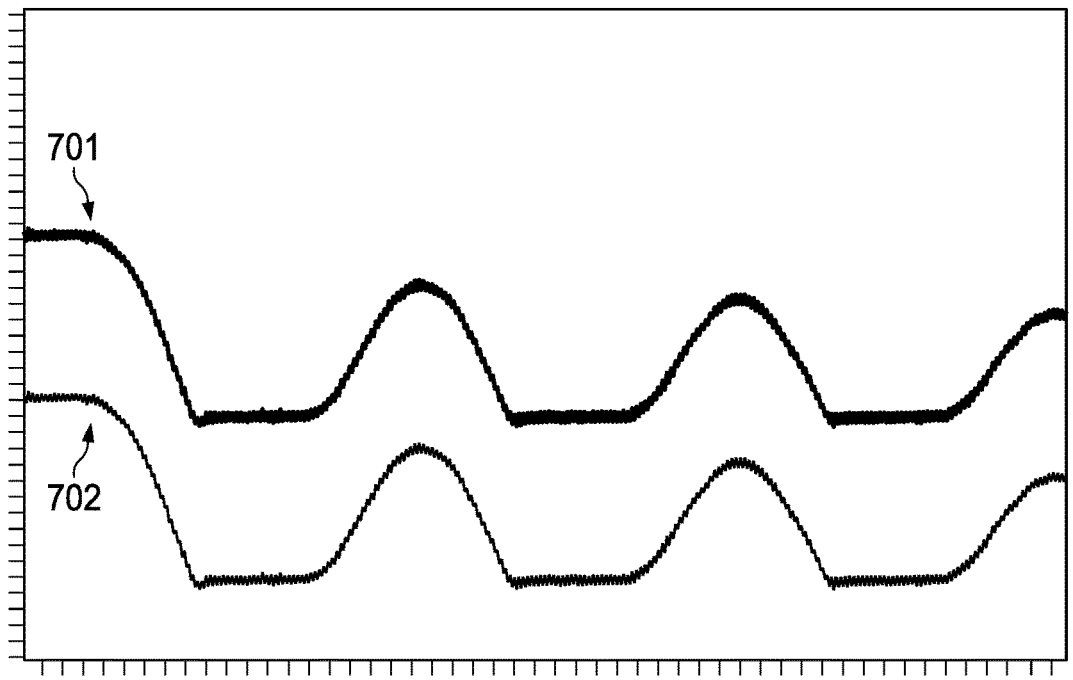
FIG. 7 illustrates a sample output waveform of an example operating environment for magnetic tamper detection.

FIG. 7 illustrates a sample output waveform of an example operating environment for magnetic tamper detection. FIG. 7 shows waveform 700, which includes pin voltage 701, pin voltage 702 and resonant frequency 705. For example, waveform 700 can be implemented in accordance with a schematic, system or method described above, such as by flyback converter 104 of FIG. 1, AC/DC flyback 320 of FIG. 3, and/or power stage 405 of FIG. 4.

Waveform 700 demonstrates resonant ringing at a different measurement point of an operating environment, such as at a voltage pin (VS Pin) of a controller within a flyback converter. Pin voltage 701 and pin voltage 702 represent measurements of input voltages at this controller pin of 325 VDC and 600 VDC, respectively. In various embodiments, these measurements can be obtained after a full demagnetization of a transformer core of the flyback converter. Thus, as in FIGS. 5 and 6, a constant resonant frequency can be achieved, even from a different measurement point and regardless of an input pin voltage within the operating environment.

Figure 8:
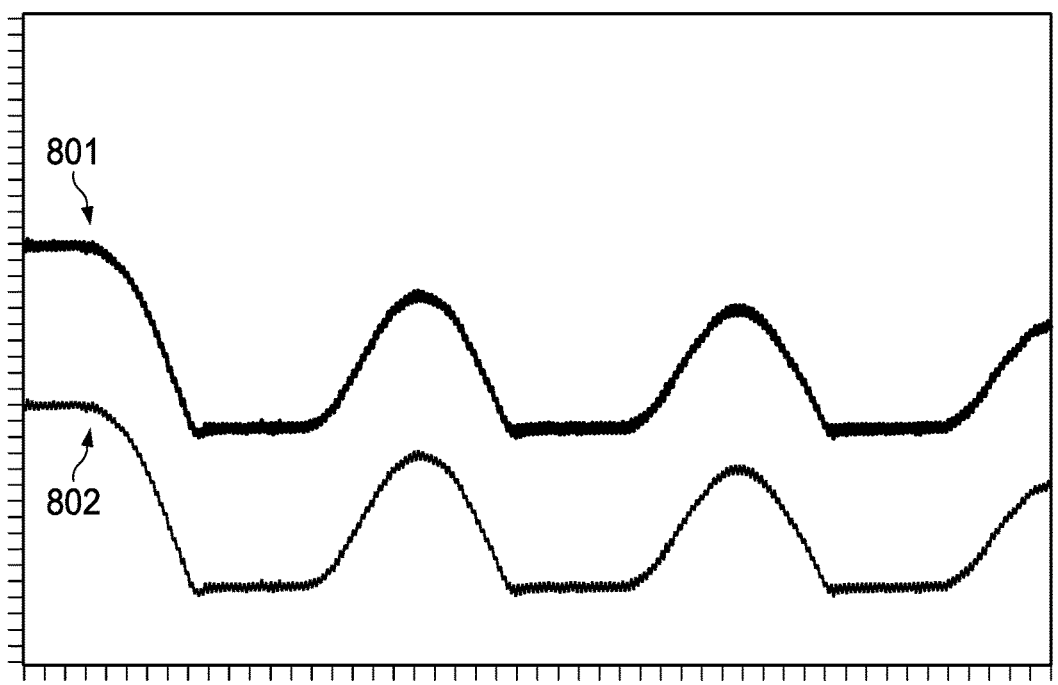
FIG. 8 illustrates a sample output waveform of an example operating environment for magnetic tamper detection.

FIG. 8 illustrates a sample output waveform of an example operating environment for magnetic tamper detection. FIG. 8 shows waveform 800, which includes load current 801, load current 802 and resonant frequency 805. For example, waveform 800 can be implemented in accordance with a schematic, system or method described above, such as by flyback converter 104 of FIG. 1, AC/DC flyback 320 of FIG. 3, and/or power stage 405 of FIG. 4.

Waveform 800 demonstrates resonant ringing of measurements captured at a voltage pin (VS Pin) of a controller of a flyback converter. Load current 801 and load current 802 represent measurements of load current at this controller pin. Load current 801 has a current of 1 A while load current 802 has a current of 100 mA. In various embodiments, these measurements can be obtained after a full demagnetization of a transformer core of the flyback converter. Thus, as in FIGS. 5 and 6, a constant resonant frequency can be achieved from the flyback converter regardless of an input pin voltage and load current within the operating environment.

Figure 9:
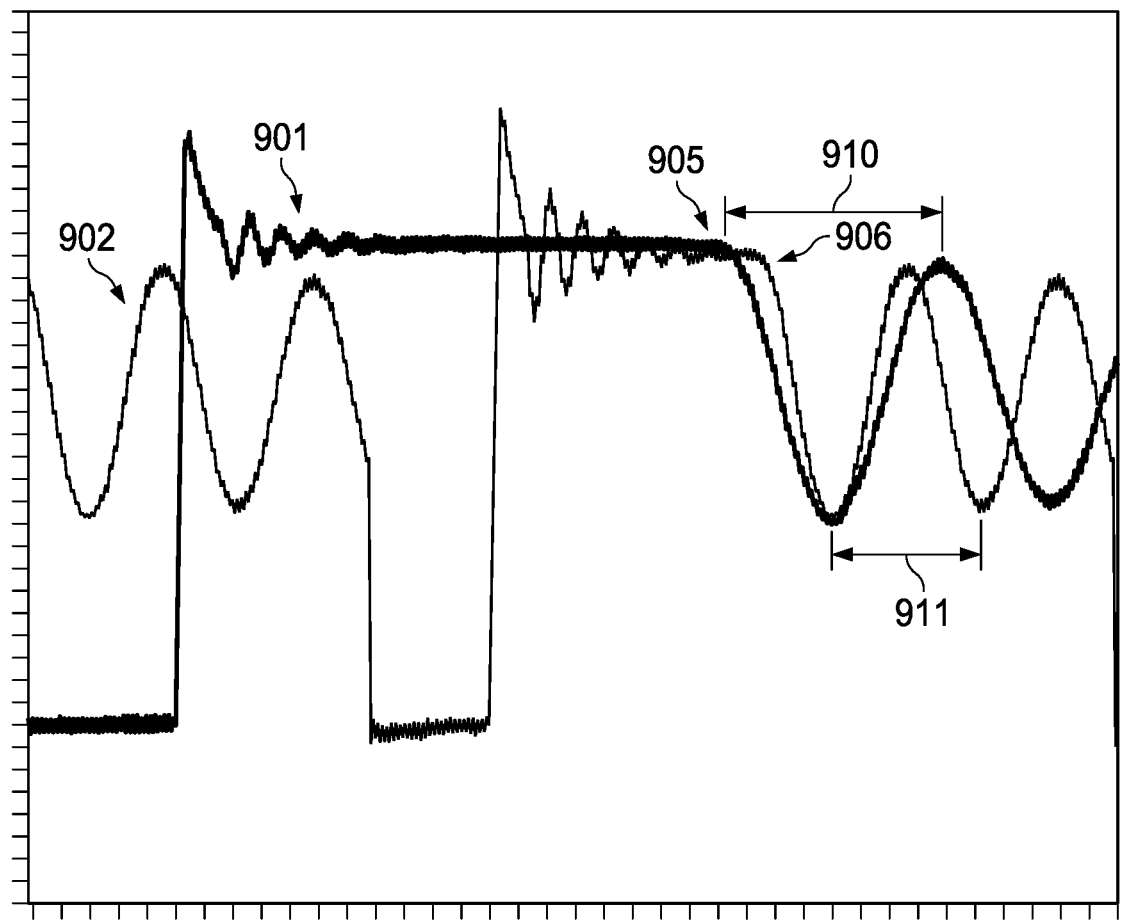
FIG. 9 illustrates a sample output waveform of an example operating environment for magnetic tamper detection.

FIG. 9 illustrates a sample output waveform of an example operating environment for magnetic tamper detection. FIG. 9 shows waveform 900, which includes two switch terminal voltage measurements. First, it includes switch terminal voltage 901, its demagnetization point 905 and its resonant frequency 910. Second, it also includes magnetically-induced switch terminal voltage 902, demagnetization point 906 and resonant frequency 911. For example, waveform 900 can be implemented in accordance with a schematic, system or method described above, such as by flyback converter 104 of FIG. 1, AC/DC flyback 320 of FIG. 3, and/or power stage 405 of FIG. 4.

Waveform 900 shows two measurements of the switch terminal voltage. Switch terminal voltage 901 demonstrates the voltage without an external magnetic field, and magnetically-induced switch terminal voltage 902 demonstrates the same voltage measurement affected by an external magnetic field of about 200 mT. After demagnetization point 905, switch terminal voltage 901 reaches a constant resonance frequency illustrated by resonant frequency 910. However, for magnetically-induced switch terminal voltage 902, after its demagnetization point 906, its resonance frequency has increased due to the external magnetic field, which is illustrated by resonant frequency 911. To generate the external magnetic field, a commercially available block magnet (e.g., an N35, Neodym-Iron-Boron, 50 mm×12.5 mm×50 mm) can be placed near the transformer of the flyback converter. Without the external magnetic field, resonant frequency 910 is about 330 kHz. But with the external magnetic field, resonant frequency is about 480 kHz. In various embodiments, a threshold frequency can be set. And if that measurement is breached, then an event can be triggered to alert for a magnetic tampering attack, among other actions.

In various implementations, the systems, methods, processes and operational scenarios may be implemented in computer software executed by a computing apparatus within a smart meter, power meter, gas meter, electric meter, other utility meter, or any other type of device capable of executing software (such as computers and mobile phones). The computing apparatus may load and execute the software from a storage system or may be preprogrammed with the software. When executed by the computing apparatus, the software directs the computing apparatus to operate as described herein for at least the various processes, operational scenarios, and sequences described herein.

Example computing apparatus may include a microprocessor and other circuitry that retrieves and executes software from storage. The computing apparatus may be implemented within a single processing device or distributed across multiple processing devices or subsystems that cooperate in executing program instructions. Examples of computing apparatus include general purpose central processing units (such as microprocessors), graphical processing units, application specific integrated circuits and logic devices, and any other type of processing device, combinations or variations thereof.

An example storage system may include any non-transitory computer readable storage media readable by a computing apparatus and capable of storing software. The storage system may include volatile and nonvolatile, removable and non-removable media implemented in any method or technology for storage of information, such as computer readable instructions, data structures, program modules or other data. Examples of storage media include random access memory, read only memory, magnetic disks, optical disks, flash memory, virtual memory and non-virtual memory, magnetic cassettes, magnetic tape, magnetic disk storage or other magnetic storage devices, or any other suitable storage media. In this example, the computer readable storage media is not merely a transient signal.

The software may be implemented in program instructions that may, when executed by a computing apparatus, direct the computing apparatus to operate with respect to the various operational scenarios, sequences and processes described herein. For example, the program instructions may include various components or modules that cooperate or otherwise interact to perform the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation or combination thereof. The software may include additional processes, programs or components, such as operating system software, virtualization software or other application software. The software may also include firmware or some other form of machine-readable processing instructions executable by a suitable computing apparatus.

Generally, the software may, when loaded into a computing apparatus and executed, transform a suitable apparatus, system or device overall from a general-purpose computing system into a special-purpose computing system as described herein. Encoding the software on a storage system may transform the physical structure of the storage system. The specific transformation of the physical structure may depend on various factors in different implementations of this description. Examples of such factors may include technology to implement the storage media of the storage system, and whether the computer-storage media are characterized as primary or secondary storage, and other factors.

For example, if the computer readable storage media are implemented as semiconductor-based memory, then the software may transform the physical state of the semiconductor memory when the program instructions are encoded therein, such as by transforming the states of transistors, capacitors or other discrete circuit elements constituting the semiconductor memory. A similar transformation may occur with respect to magnetic or optical media. Other transformations of physical media are possible.

Embodiments herein may include smart meters, utility meters and/or other devices, which may include a communication interface system and/or a user interface system. The communication interface system may include communication connections and devices that allow communication with other computing systems and devices (not shown) over communication networks (not shown). Examples of connections and devices that together allow inter-system communication may include network interface cards, antennas, power amplifiers, RF circuitry, transceivers and other communication circuitry. The connections and devices may communicate over communication media to exchange communications with other computing systems or networks of systems, such as metal, glass, air or any other suitable communication media.

Communication between such systems and devices may occur over a communication network or networks in accordance with various communication protocols, combinations of protocols or variations thereof. Examples include intranets, internets, the Internet, local area networks, wide area networks, wireless networks, wired networks, virtual networks, software defined networks, data center buses and backplanes, or any other type of network, combination of network or variation thereof.

A user interface system may be any one or more of a display device, a touch input device for receiving a touch gesture from a user, and a magnetic tampering detection device for detecting magnetic interference and non-touch gestures and other motions by a user. The user interface system may also include output devices, such as a display, speakers, haptic devices and other types of output devices. In some examples, the input and output devices may be combined in a single device, such as a display capable of displaying images and receiving touch gestures. The user interface system may also include associated user interface software executable by a suitable computing apparatus in support of the various user input and output devices described herein. Separately or in conjunction with each other and other hardware and software elements, the user interface software and user interface devices may support a graphical user interface, a natural user interface or any other type of user interface.

While some examples herein are described in the context of a smart meter and magnetic tamper detection processes, the magnetic tamper detection systems and methods described herein are not limited to such embodiments and may apply to various other smart meters, utility meters and their associated systems. Techniques described herein may be embodied in a system, method, computer program product and other configurable systems. Accordingly, aspects described herein may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects described herein may take the form of a computer program product embodied in one or more computer readable medium(s) having computer readable program code embodied thereon.

In this description, the terms "connected," "coupled" or any variant thereof mean any connection or coupling, either direct or indirect, between two or more elements. Also, the coupling or connection between the elements can be physical, logical or a combination thereof.

Processes or blocks may be shown or described in a particular order herein, but alternative implementations may perform routines having steps or include systems having blocks, in a different order, and some processes or blocks may be deleted, moved, added, subdivided, combined and/or modified to provide alternative combinations or subcombinations. Each of these processes or blocks may be implemented in various ways. Also, while processes or blocks may be shown or described herein as being performed in series, these processes or blocks may instead be performed or implemented in parallel or may be performed at different times.

In this description, unless otherwise stated, "about," "approximately" or "substantially" preceding a parameter means being within +/−10 percent of that parameter.

Modifications are possible in the described examples, and other examples are possible within the scope of the claims.

What is claimed is:

1. A system, comprising:
  a flyback converter having a resonant frequency and a discontinuous conduction mode, the flyback converter including a controller configured to:
    determine a first resonant frequency during the discontinuous conduction mode after a startup and demagnetization period of the flyback converter;
    determine a second resonant frequency during the discontinuous conduction mode at a second time;
    determine a threshold based on the first resonant frequency;
    determine whether the second resonant frequency exceeds the threshold; and responsive to determining that the resonant frequency exceeds the threshold, trigger an event.

2. The system of claim 1, wherein:
the controller includes first and second controllers;
the first controller has an output and is configured to: control the flyback converter; determine whether the resonant frequency exceeds the threshold; and responsive to determining that the resonant frequency exceeds the threshold, provide an indication at the output; and
the second controller has an input coupled to the output and is configured to trigger the event responsive to the indication.

3. The system of claim 2, wherein the second controller is configured to power down the flyback converter responsive to the event.

4. The system of claim 1, wherein the resonant frequency represents a frequency after demagnetization of a transformer core of the flyback converter.

5. The system of claim 1, wherein the controller is configured to determine whether the resonant frequency exceeds the threshold, responsive to resonant frequency measurements at a switch terminal of the flyback converter.

6. The system of claim 1, wherein the threshold is based on a difference between the first resonant frequency and the second resonant frequency.

7. The system of claim 1, wherein the event is an alert signifying a magnetic tampering attack.

8. A computing apparatus, comprising:
a computer-readable storage medium; and
program instructions stored on the computer-readable storage medium that, when executed by the computing apparatus, direct the computing apparatus to at least:
determine a first resonant frequency of a flyback converter in a power meter, at a switch terminal of the flyback converter in a discontinuous conduction mode after a startup and demagnetization period of the flyback converter;
determine a second resonant frequency during the discontinuous conduction mode at a second time;
determine a threshold based on the first resonant frequency
determine whether the second resonant frequency exceeds the threshold; and
trigger, via a controller, an event responsive to determining that the second resonant frequency exceeds the threshold.

9. The computing apparatus of claim 8, wherein the program instructions direct the computing apparatus to set the threshold and configure the controller to detect a difference between the threshold and the second resonant frequency.

10. The computing apparatus of claim 9, wherein the difference in the resonant frequency is caused by an external magnetic field.

11. The computing apparatus of claim 8, wherein the event is an alert signifying a magnetic tampering attack.

12. The computing apparatus of claim 11, wherein the program instructions direct the computing apparatus to power down the power meter responsive to the alert.

13. The computing apparatus of claim 11, wherein the program instructions direct the computing apparatus to store data pertaining to the magnetic tampering attack responsive to the alert.

14. A method of detecting magnetic tampering in a power meter, the method comprising:
determining a first resonant frequency of a flyback converter in the power meter, at a switch terminal of the flyback converter in a discontinuous conduction mode after a startup and demagnetization period of the flyback converter;
determining a second resonant frequency during the discontinuous conduction mode at a second time;
determining a threshold based on the first resonant frequency;
determining whether the second resonant frequency exceeds the threshold; and
triggering, via a controller, an event responsive to determining that the second resonant frequency exceeds the threshold.

15. The method of claim 14, further comprising setting the threshold and configuring the controller to detect a difference between the threshold and the second resonant frequency.

16. The method of claim 14, wherein the determining of the threshold is based on an operational resonant frequency of the first resonant frequency.

17. The method of claim 14, wherein the event is an alert signifying a magnetic tampering attack.

18. The method of claim 17, further comprising powering down the power meter responsive to the alert.

19. The method of claim 17, further comprising storing data pertaining to the magnetic tampering attack responsive to the alert.

* * * * *